US012795812B2

(12) United States Patent
Jeong et al.

(10) Patent No.: US 12,795,812 B2
(45) Date of Patent: Nov. 10, 2026

(54) RF CONNECTOR AND COMMUNICATION APPARATUS INCLUDING SAME

(71) Applicant: KMW INC., Hwaseong-si (KR)

(72) Inventors: Bae Mook Jeong, Suwon-si (KR); Kyo Sung Ji, Hwaseong-si (KR); Seong Min Ahn, Namyangju-si (KR); Chi Back Ryu, Hwaseong-si (KR); Jae Eun Kim, Suwon-si (KR); Seung Min Lee, Suwon-si (KR); Ki Hun Park, Hwaseong-si (KR); Won Jun Park, Yongin-si (KR); Duk Yong Kim, Yongin-si (KR)

(73) Assignee: KMW INC., Hwaseong-si (KR)

( * ) Notice: Subject to any disclaimer, the term of this patent is extended or adjusted under 35 U.S.C. 154(b) by 349 days.

(21) Appl. No.: 18/525,907

(22) Filed: Dec. 1, 2023

(65) Prior Publication Data

US 2024/0098885 A1 Mar. 21, 2024

Related U.S. Application Data

(63) Continuation of application No. PCT/KR2022/007305, filed on May 23, 2022.

(30) Foreign Application Priority Data

Jun. 1, 2021 (KR) ........................ 10-2021-0070776
May 23, 2022 (KR) ........................ 10-2022-0062839

(51) Int. Cl.
*H05K 1/02* (2006.01)
*H05K 1/14* (2006.01)

(52) U.S. Cl.
CPC ......... *H05K 1/0242* (2013.01); *H05K 1/0243* (2013.01); *H05K 1/142* (2013.01); *H05K 1/145* (2013.01); *H05K 2201/10098* (2013.01)

(58) Field of Classification Search
CPC ......... H05K 2201/10098; H05K 1/142; H05K 5/0069; H05K 5/0065; H05K 1/0242; H05K 1/0243
See application file for complete search history.

(56) References Cited

U.S. PATENT DOCUMENTS

2005/0120553 A1 6/2005 Brown et al.
2007/0149000 A1 6/2007 Baskaran et al.
2012/0190219 A1 * 7/2012 Pai ....................... H01R 12/721 439/65

FOREIGN PATENT DOCUMENTS

CN 102377058 A 3/2012
JP 2004-342325 A 12/2004
(Continued)

OTHER PUBLICATIONS

International Search Report mailed Sep. 1, 2022 for International Application No. PCT/KR2022/007305 and its English translation.
(Continued)

*Primary Examiner* — Jeremy C Norris
(74) *Attorney, Agent, or Firm* — Lex IP Meister, PLLC

(57) ABSTRACT

A communication apparatus is provided to include an apparatus enclosure that includes a substrate seating surface and at least one or more connection grooves formed on the substrate seating surface, a first printed circuit board disposed on the substrate seating surface, a second printed circuit board disposed on the substrate seating surface on one side of the first printed circuit board, and at least one or more connectors disposed within the connection groove and configured to electrically connect the first printed circuit board and the second printed circuit board.

18 Claims, 12 Drawing Sheets

(56) References Cited

FOREIGN PATENT DOCUMENTS

| | | | |
|---|---|---|---|
| JP | 2012-049212 | A | 3/2012 |
| JP | 2012-529166 | A | 11/2012 |
| JP | 2012-253096 | A | 12/2012 |
| KR | 10-2011-0115514 | A | 10/2011 |
| KR | 10-2015-0086714 | A | 7/2015 |
| KR | 10-2020-0096116 | A | 8/2020 |

OTHER PUBLICATIONS

European Search Report mailed on Jul. 15, 2025 from the European Patent Office for European Application No. 22816361.4.

Non-final Office Action mailed on Dec. 3, 2024 from the Japanese Patent Office for Japanese Application No. 2023-571802 and its English translation.

* cited by examiner

RF CONNECTOR AND COMMUNICATION APPARATUS INCLUDING SAME

CROSS-REFERENCE TO RELATED APPLICATIONS

This application is a continuation application of International Application No. PCT/KR2022/007305, filed May 23, 2022, which claims the benefit of Korean Patent Application Nos. 10-2021-0070776, filed Jun. 1, 2021; and 10-2022-0062839, filed May 23, 2022, in the Korean Intellectual Property Office, the disclosures of which are incorporated herein in their entirety by reference.

TECHNICAL FIELD

The present disclosure relates to a radio frequency (RF) connector and a communication apparatus including the same.

BACKGROUND

The statements in this section merely provide background information related to the present disclosure and do not necessarily constitute prior art.

It is a common practice to use RF connectors to send and receive RF signals between printed circuit boards (PCBs). RF connectors include single connectors that transmit a single frequency signal and multi-connectors that transmit signals of different frequency bands. In particular, in recent years, multi-connectors have been substantially used to handle signals of different frequency bands.

However, these connectors alone have a significant footprint or volume, and the connector is so structured as to cause a height difference between the PCBs when connecting, which increases the overall size of the components.

In addition, there is a limit to the range of frequency bands that a connector can handle, and for enabling a connector to transmit signals of diverse frequency bands or a wide frequency band, the overall unit cost of the components increases.

DISCLOSURE

Technical Problem

Accordingly, directed to solving the aforementioned problems, the present disclosure seeks to provide an RF connector that can transmit RF signals in the same plane or at similar heights, thereby reducing the overall size of the components.

Further, the present disclosure seeks to provide an RF connector that is capable of handling signals of various frequency bands while simultaneously reducing unit costs.

Additionally, the present disclosure aims to provide a communication apparatus that has excellent heat dissipation performance and compact size.

SUMMARY

According to at least one embodiment, the objectives of the present disclosure are achieved by providing a communication apparatus including an apparatus enclosure that includes a substrate seating surface and at least one or more connection grooves formed on the substrate seating surface, a first printed circuit board disposed on the substrate seating surface, a second printed circuit board disposed on the substrate seating surface on one side of the first printed circuit board, and at least one or more connectors disposed within the connection groove and configured to electrically connect the first printed circuit board and the second printed circuit board.

Advantageous Effects

The communication apparatus according to the present disclosure can utilize an RF connector to transmit RF signals in the same plane or at similar heights, thereby reducing the overall size of the components.

Furthermore, the RF connector according to the present disclosure can handle signals of various frequency bands while simultaneously reducing the unit costs.

Furthermore, the communication apparatus according to the present disclosure has the effect of excellent heat dissipation performance and a compact size.

Figure 1:
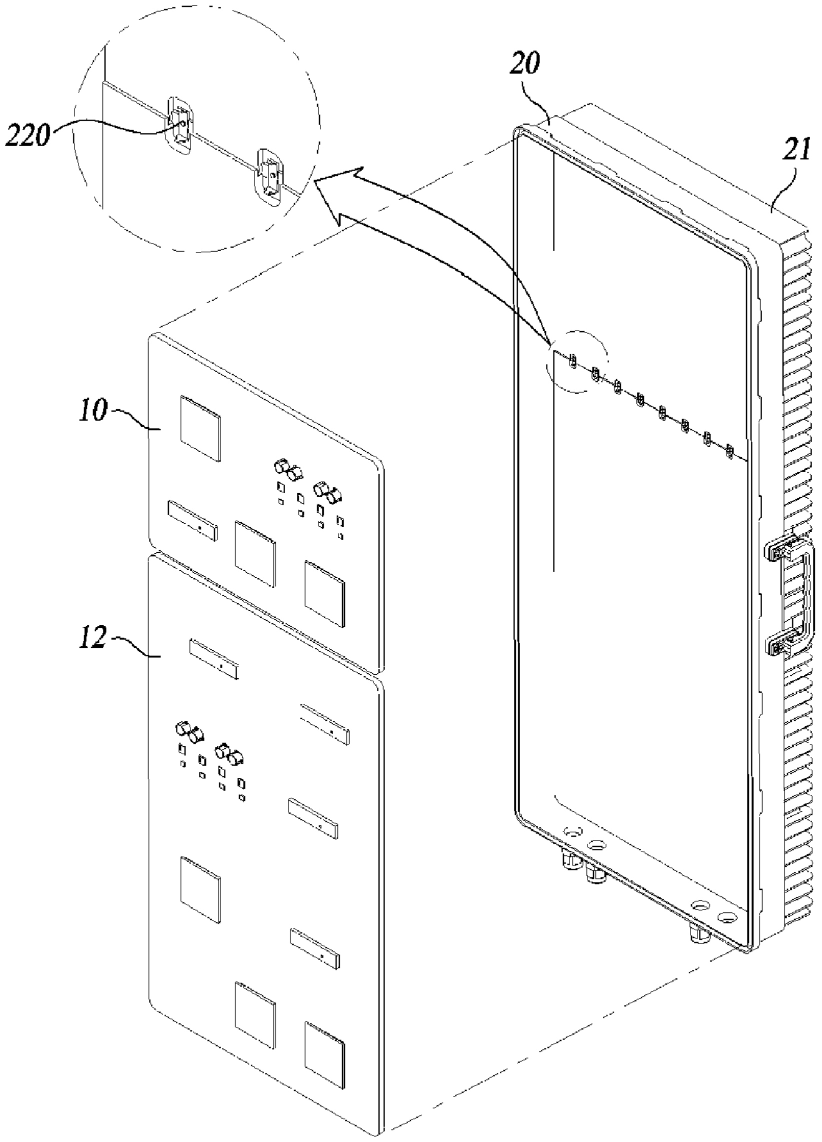
FIG. 1 is a perspective view of some components of a communication apparatus according to at least one embodiment of the present disclosure.

| REFERENCE NUMERALS |
| --- |
| 10: first printed circuit board |
| 12: second printed circuit board |
| 20: apparatus enclosure |
| 220: connection groove |
| 300: connector |
| 310: support member |
| 320: elastic connection member |

DETAILED DESCRIPTION

Hereinafter, some embodiments of the present disclosure will be described in detail with reference to the accompanying illustrative drawings. In the following description, like reference numerals preferably designate like elements, although the elements are shown in different drawings. Further, in the following description of some embodiments, a detailed description of related known components and functions when considered to obscure the subject of the present disclosure will be omitted for the purpose of clarity and for brevity.

In describing the components of embodiments of the present disclosure, various ordinal numbers or alpha codes such as first, second, i), ii), a), b), etc. may be used. These are prefixed solely to differentiate one component from the other but not to limit the substances, order, or sequence of the components. Throughout this specification, when a part "includes" or "comprises" a component, the part is meant to further include other components, not to exclude thereof unless specifically stated to the contrary.

FIG. 1 is a perspective view of some components of a communication apparatus according to at least one embodiment of the present disclosure.

Figure 2A:
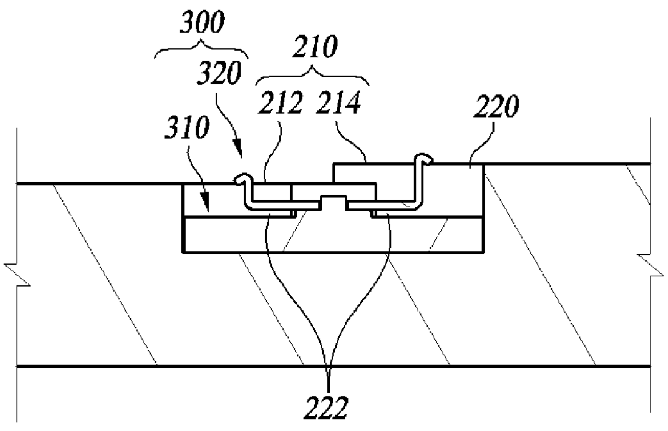
FIG. 2A is a partial cross-sectional view of a communication apparatus according to at least one embodiment of the present disclosure, with no printed circuit boards arranged.

FIG. 2A is a partial cross-sectional view of a communication apparatus according to at least one embodiment of the present disclosure, with no printed circuit boards arranged.

Figure 2B:
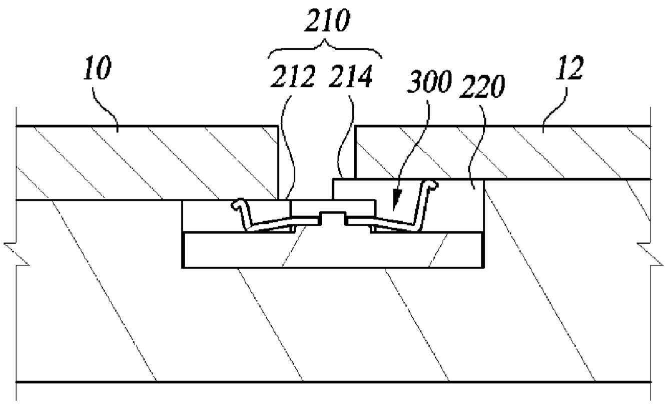
FIG. 2B is a partial cross-sectional view of the communication apparatus according to at least one embodiment of the present disclosure, with printed circuit boards arranged.

FIG. 2B is a partial cross-sectional view of the communication apparatus according to at least one embodiment of the present disclosure, with printed circuit boards arranged.

Figure 3:
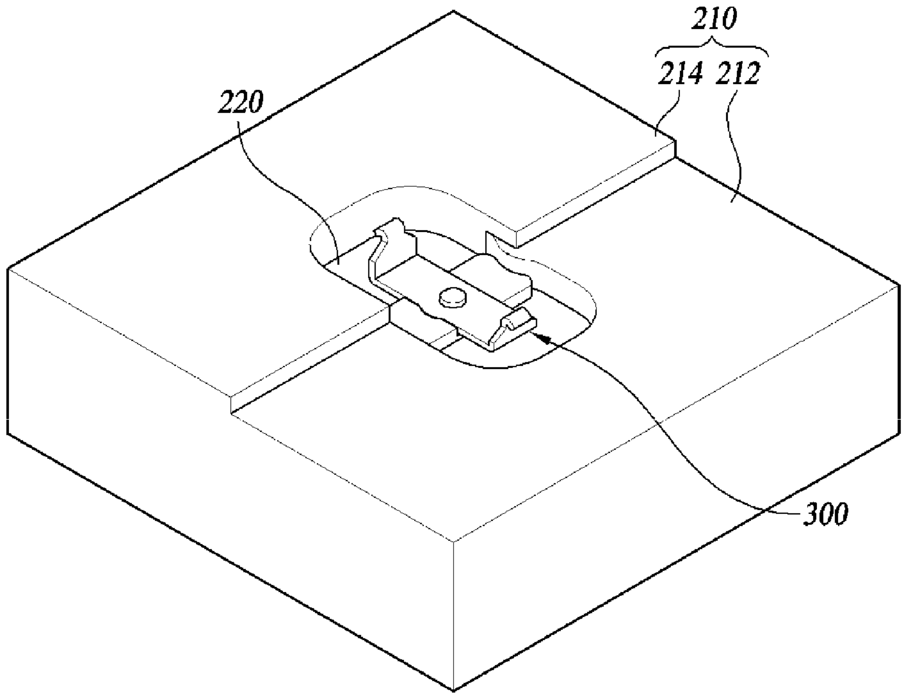
FIG. 3 is a partial perspective view of a communication apparatus according to at least one embodiment of the present disclosure.

FIG. 3 is a partial perspective view of a communication apparatus according to at least one embodiment of the present disclosure.

Referring to FIGS. 1 through 3, a communication apparatus according to at least one embodiment of the present disclosure includes all or part of an apparatus enclosure 20, a first printed circuit board 10, a second printed circuit board 12, and one or more connectors 300.

The apparatus enclosure 20 includes substrate seating surface 210 on which the first printed circuit board 10 and the second printed circuit board 12 are seated, and it also includes one or more connection grooves 220 formed in the substrate seating surface 210. The apparatus enclosure 20 may be formed of a thermally conductive rigid member, for example, an aluminum alloy or a stainless steel alloy.

In at least one embodiment of the present disclosure, the apparatus enclosure 20 is illustrated as an outer housing that forms the exterior of the communication apparatus, is configured to support the apparatus structure, and is configured to receive printed circuit boards. The outer housing includes a plurality of heat sink fins 21 formed on at least some of its faces.

However, the present disclosure is not limited to this, and the apparatus enclosure 20 may be a separate configuration other than the outer housing, for example, a separate thermally conductive rigid member supporting the printed circuit boards between the outer housing and the printed circuit boards.

The substrate seating surface 210 may include a first seating surface 212 on which the first printed circuit board 10 is seated and a second seating surface 214 on which the second printed circuit board 12 is seated. The first seating surface 212 and the second seating surface 214 may be formed to have an offset between them.

In at least one embodiment of the present disclosure, the first printed circuit board 10 and the second printed circuit board 12 may have different thicknesses. The offset of the first seating surface 212 and the second seating surface 214 may correspond to the difference in thickness of the first printed circuit board 10 and the second printed circuit board 12. This can level in the same plane or substantially level the top surface of the first printed circuit board 10, which is the opposite side of the side supported on the substrate seating surface 210, and the top surface of the second printed circuit board 12, which is the opposite side of the side supported on the substrate seating surface 210.

Although not shown herein, the arrangement of the first printed circuit board 10 and the second printed circuit board 12 in the same plane may be advantageous in reducing or optimizing the size and weight of the communication apparatus as a whole, for example, in the placement of any connectors 300 for directly connecting the two, a support for the two circuit boards, or filters or any other devices that are installed on the top surfaces of the circuit boards.

One or more connection grooves 220 are formed within the substrate seating surface 210, for example, as a plurality of connection grooves 220 along a boundary between the first seating surface 212 and the second seating surface 214.

The first printed circuit board 10 may include a plurality of devices mounted thereon. In implementing an RF connector according to at least one embodiment of the present disclosure, the first printed circuit board 10 may be, but is not necessarily limited to, an amplifier board.

The second printed circuit board 12, with a plurality of devices mounted thereon, may be disposed spaced apart adjacent to the first printed circuit board 10 at one side thereof. In implementing an RF connector according to at least one embodiment of the present disclosure, the second printed circuit board 12 may be, but is not necessarily limited to, a digital board.

The one or more connectors 300 are disposed within the one or more connection grooves 220 and are configured to electrically connect the first printed circuit board 10 and the second printed circuit board 12.

Figure 4:
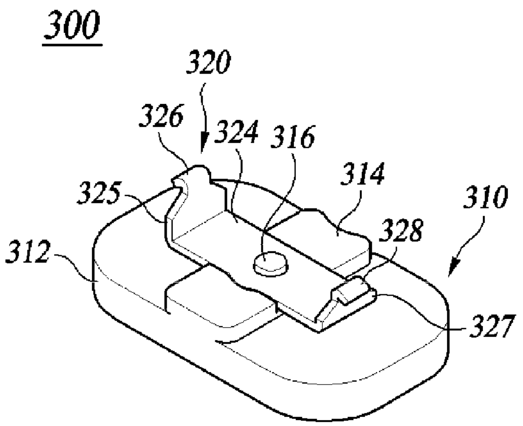
FIG. 4 is a perspective view of a connector alone of a communication apparatus according to at least one embodiment of the present disclosure.

FIG. 4 is a perspective view of a connector alone of a communication apparatus according to at least one embodiment of the present disclosure.

Referring further to FIG. 4, the connector 300 may include a support member 310 and an elastic connection member 320.

The support member 310 may contact at least a portion of the apparatus enclosure 20 within the connection groove 220. The support member 310 may be made of an insulating material, such as a high heat-resistant thermoplastic, such as polycarbonate, Lusep, or Teflon.

The elastic connection member 320 may be made of an electrically conductive material, for example, a material that is elastic and suitable for transmitting high-frequency signals (RF signals), such as beryllium copper (BeCu) or stainless steel alloy (SUS). The elastic connection member 320 is disposed between the support member 310 and the first printed circuit board 10 or the second printed circuit board 12 and is configured to electrically interconnect the first printed circuit board 10 and the second printed circuit board 12.

Further, the elastic connection member 320 may include a plate-like base 324, a first sidewall 325 formed at one end of the plate-like base 324, a first contact portion 326 formed at one end of the first side, a second sidewall 327 formed at the other end of the plate-like base 324, and a second contact portion 328 formed at the other end of the second sidewall 327. The structure of the elastic connection member 320 may be formed by bending.

As previously described, the substrate seating surface 210 may have an offset corresponding to a difference in thickness of the first printed circuit board 10 and the second printed circuit board 12. Further, in the elastic connection member 320, the length or vertical height of the first sidewall 325 may be different from that of the second sidewall 327 to be corresponding to this offset.

The support member 310 may include a support base 312, a protruding seat 314 that protrudes from one side of the support base 312 and is configured to seat the elastic connection member 320, and a retaining member 316 formed to secure the elastic connection member 320 on the protruding seat 314.

As shown in FIG. 2A, the plate-like base 324 of the elastic connection member 320 is supported on the protruding seat 314, such that a deformation gap 222 may be formed between the plate-like base 324 of the elastic connection member 320 and the support base 312 of the support member 310.

In an illustrative embodiment of the present disclosure, the connector 300 may include the deformation gap 222 formed between the support base 312 and the elastic connection member 320 to be responsive to the first printed circuit board 10 or the second printed circuit board 12 being seated on the substrate seating surface 210 for allowing the elastic connection member 320 to elastically deform (see FIG. 2B) by the first contact portion 326 and the second contact portion 328 as being depressed by the lower surfaces of the printed circuit boards 10, 12, respectively.

Additionally, in at least one embodiment of the present disclosure, the retaining member 316 may be provided as, for example, a retaining protrusion formed on the protruding seat 314. The elastic connection member 320 may include a through-hole into which the retaining protrusion is inserted.

Furthermore, in at least one embodiment of the present disclosure, the connector 300 may be manufactured by multi-component injection molding. For example, the elastic connection member 320 and the support member 310 may be integrally formed by multi-component injection molding. However, the present disclosure is not limited to this, and the elastic connection member 320 and the support member 310 may each be manufactured separately and joined together through a separate assembly process.

In the illustrated embodiment of the present disclosure, the connector 300 is illustrated as having a structure and size for transmitting and receiving high-frequency signals. However, the present disclosure is not limited to this. The connector 300 may be modified to have a structure sized to carry other signals than high-frequency signals, such as electric power or analog or digital low-frequency signals.

Figure 5A:
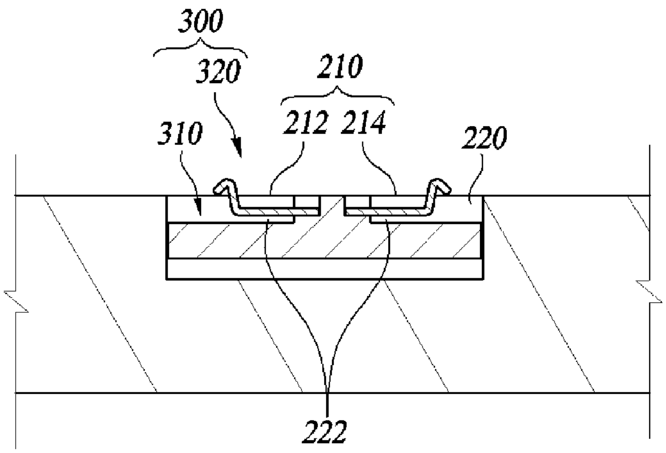
FIG. 5A is a partial cross-sectional view of a communication apparatus according to another embodiment of the present disclosure before printed circuit boards with a common height are connected to a connector.

FIG. 5A is a partial cross-sectional view of a communication apparatus according to another embodiment of the present disclosure before printed circuit boards with a common height are connected to a connector.

Figure 5B:
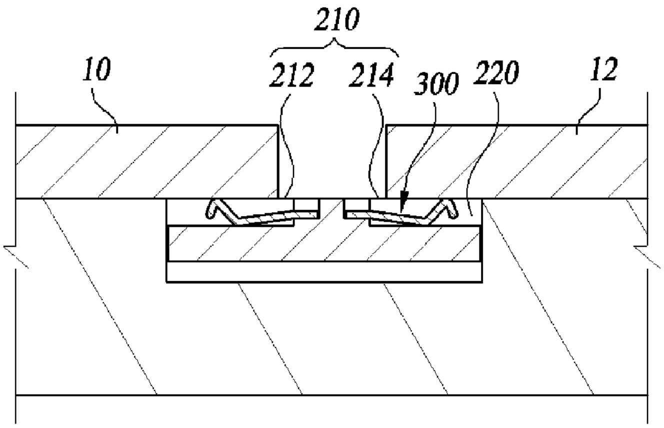
FIG. 5B is a partial cross-sectional view of the communication apparatus according to another embodiment of the present disclosure when the printed circuit boards with a common height connect to the connector.

FIG. 5B is a partial cross-sectional view of the communication apparatus according to another embodiment of the present disclosure when the printed circuit boards with a common height connect to the connector.

Figure 6:
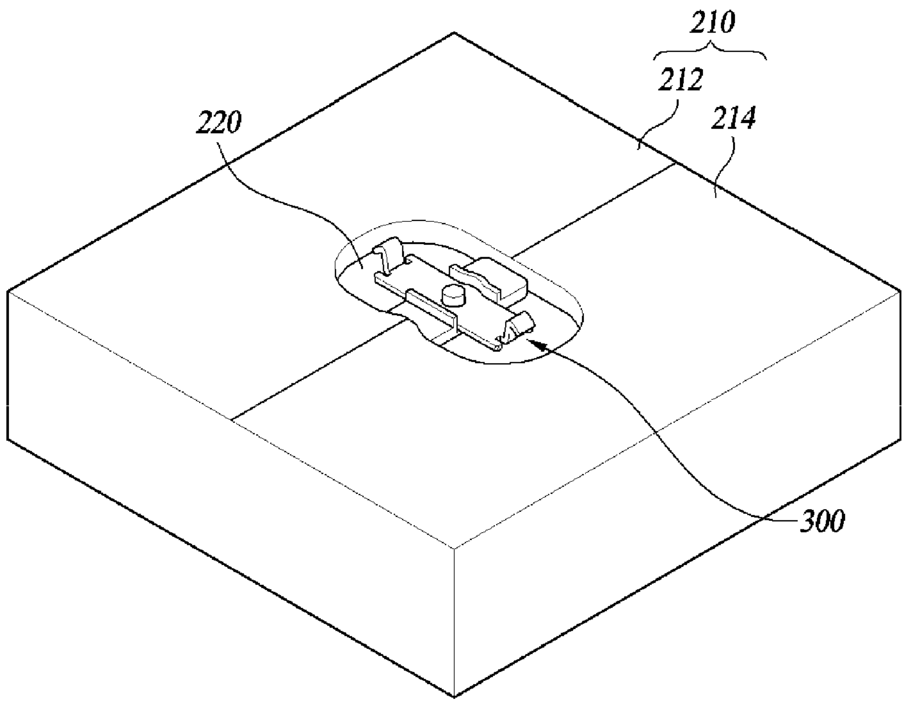
FIG. 6 is a partial perspective view of a communication apparatus according to another embodiment of the present disclosure.

FIG. 6 is a partial perspective view of a communication apparatus according to another embodiment of the present disclosure.

Figure 7:
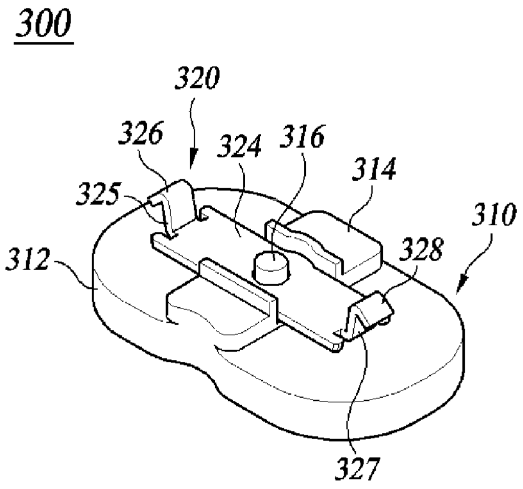
FIG. 7 is a perspective view of a connector alone of a communication apparatus according to another embodiment of the present disclosure.

FIG. 7 is a perspective view of a connector alone of a communication apparatus according to another embodiment of the present disclosure.

Referring to FIGS. 5 through 7, a communication apparatus according to another embodiment of the present disclosure will be described. It should be noted that a redundant explanation of the common features between the aforementioned embodiment and other embodiments will be omitted. However, those features of the aforementioned embodiment may be equally or similarly applied to the other embodiments to the extent that they are not against the other embodiments.

According to another embodiment of the present disclosure, the first seating surface 212 and the second seating surface 214 may be formed in a plane to have the same or similar height, i.e., no offset. The first printed circuit board 10 and the second printed circuit board 12 may have the same or similar thickness. Accordingly, the top surface of the first printed circuit board 10 and the top surface of the second printed circuit board 12 may be disposed on the same plane or substantially the same plane.

Where the first printed circuit board 10 and the second printed circuit board 12 are formed with the same or similar thickness, the substrate seating surface 210 may be formed in a planar shape without an offset. In this case, the lengths (or vertical heights) of the first sidewall 325 and the second sidewall 327 of the elastic connection member 320 may be the same or similar.

Figure 8:
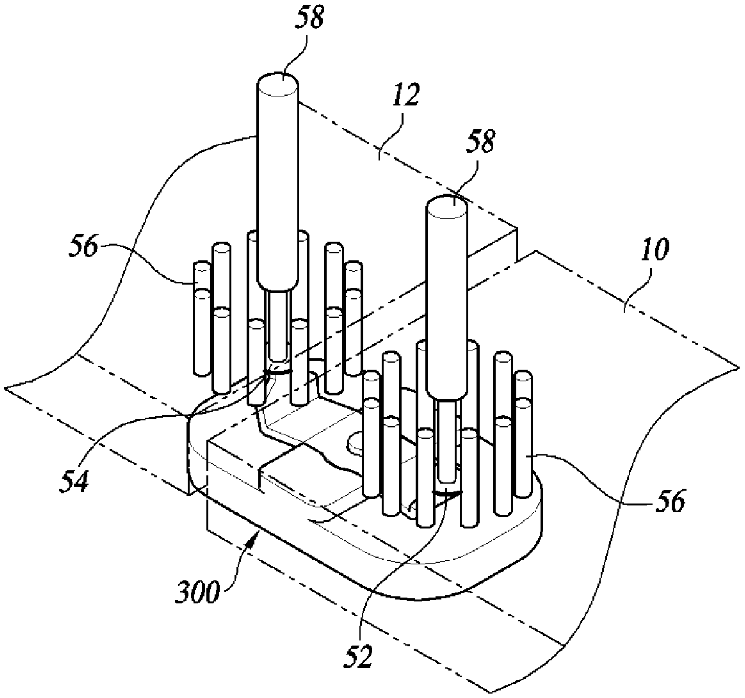
FIG. 8 is a partially see through perspective view of a simulation apparatus arranged to simulate the performance of a connector of a communication apparatus according to the present disclosure.
Figure 9:
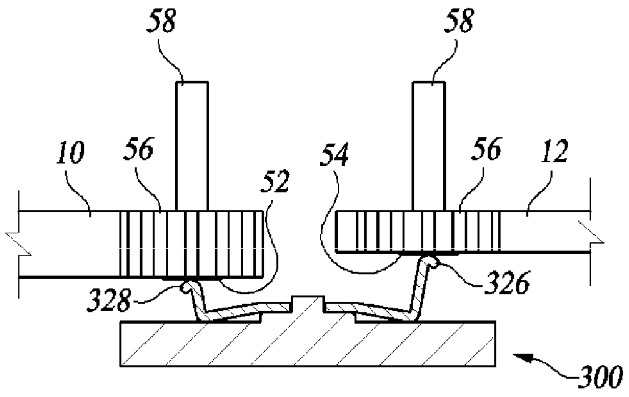
FIG. 9 is a cross-sectional view of FIG. 8.
Figure 10:
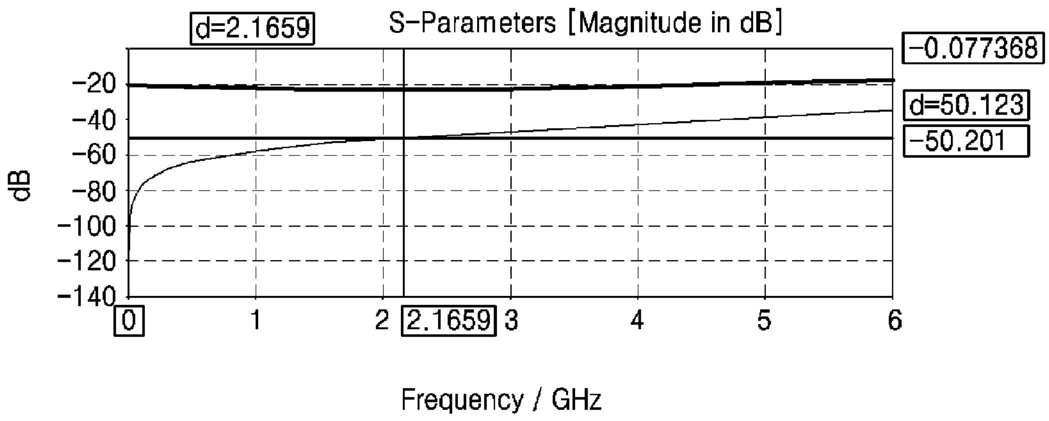
FIG. 10 is a simulation result for the communication apparatus arranged in FIGS. 8 and 9.

FIG. 8 is a partially see through perspective view of a simulation apparatus arranged to simulate the performance of a connector of a communication apparatus according to the present disclosure. FIG. 9 is a cross-sectional view of FIG. 8. FIG. 10 is a simulation result for the communication apparatus arranged in FIGS. 8 and 9.

While FIG. 9 illustrates a communication apparatus according to at least one embodiment of the present disclosure, i.e., printed circuit boards 10, 12 having different thicknesses and sidewalls 325, 327 having different heights, the effects of the present disclosure that will be described below are not exclusive to this embodiment. It should be appreciated that the same effects can occur in other embodiments of the present disclosure, i.e., where the printed circuit boards 10, 12 have the same or similar thickness and the sidewalls 325, 327 have the same or similar height.

Referring now to FIGS. 8 through 10, a virtual digital board structure and a virtual amplifier board structure were used to simulate the performance of a connector in a communication apparatus according to the present disclosure.

The virtual digital board for the second printed circuit board 12 and the virtual amplifier board for the first printed circuit board 10 respectively include a first electrode 54 and a second electrode 52 that contact the first contact portion 326 and the second contact portion 328 of the elastic connection member 320 to establish an electrical connection between the electrodes.

For simulation purposes, a plurality of via holes 56 are shown surrounding the first electrode 54 and the second electrode 52, with a port 58 for signal transmission installed on each of the first electrode 54 and the second electrode 52.

As shown in the simulation results shown in FIG. 10, for this configuration, the reflection loss of the connector 300 is found to be 20 dB. It can also be seen that when the spacing of the structure of the connector 300 is 10 mm (1 cm) and the frequency of the high-frequency signal is 2.16 GHz, the isolation value is 50 dB. It can also be seen that the insertion loss is up to 0.1 dB.

It can be seen that the isolation varies depending on the spacing of the connector structure, and the spacing of the connector structure can be determined and optimized according to the connector structure and the type of high-frequency signal by referring to the simulation results.

According to the present disclosure, since the first printed circuit board 10 and the second printed circuit board 12 are a kind of heat source, their thermal management, especially the heat dissipation performance through direct heat conduction, can be an important factor determining the performance of the entire apparatus.

Thus, in at least one embodiment of the present disclosure, the first printed circuit board 10 and the second printed circuit board 12 are arranged to be in direct contact with the apparatus enclosure 20, such as the outer housing.

However, the border area between the first printed circuit board 10 and the second printed circuit board 12 where they are spaced apart side by side has relatively little effect on the performance of heat dissipation by direct conduction of the printed circuit boards.

The present disclosure forms a connecting structure for interconnecting the two substrates in the area where they are spaced apart. Since the apparatus enclosure 20, e.g., the outer housing, is itself a metallic shielding material, the connectors according to at least one embodiment of the present disclosure can be effectively shielded inside the connection grooves 220 from the outside. Namely, without covering the connectors with a separate RF shielding member, the connectors of the communication apparatus according to the present disclosure can have a sufficient shielding effect (isolation) as shown in the simulation results above.

Furthermore, since the largest possible areas of the printed circuit boards can have a structure that directly contacts the apparatus enclosure 20, a communication apparatus having excellent heat dissipation performance and compact size can be provided.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the embodiments of the present disclosure is not limited by the illustrations. Accordingly, one of ordinary skill would understand the scope of the claimed invention is not to be limited by the above explicitly described embodiments but by the claims and equivalents thereof.

The invention claimed is:

1. A communication apparatus, comprising:
- an apparatus enclosure comprising a substrate seating surface and at least one or more connection grooves formed on the substrate seating surface;
- a first printed circuit board disposed on the substrate seating surface;
- a second printed circuit board disposed on the substrate seating surface on one side of the first printed circuit board; and
- at least one or more connectors disposed within the connection groove and configured to electrically connect the first printed circuit board and the second printed circuit board,
- wherein the apparatus enclosure comprises an outer housing configured to house one or both of the first printed circuit board and the second printed circuit board.

2. The communication apparatus of claim 1, wherein the connector comprises:
- a support member in contact with at least a portion of the apparatus enclosure within the connection groove; and
- an elastic connection member that is electrically conductive and disposed between the support member and the first printed circuit board, or between the support member and the second printed circuit board.

3. The communication apparatus of claim 2, wherein the elastic connection member comprises:

- a plate-shaped base;
- a first sidewall formed at one end of the plate-shaped base;
- a first contact portion formed at one end of the first sidewall;
- a second sidewall formed at an other end of the plate-shaped base; and
- a second contact portion formed at one end of the second sidewall.

4. The communication apparatus of claim 3, wherein the substrate seating surface comprises a first seating surface on which the first printed circuit board is seated and a second seating surface on which the second printed circuit board is seated,
- wherein the first seating surface and the second seating surface are formed to have an off-set, and
- wherein the first sidewall and the second sidewall of the elastic connection member have different lengths to correspond to the offset between the first seating surface and the second seating surface.

5. The communication apparatus of claim 4, wherein the first printed circuit board and the second printed circuit board are formed to have a thickness difference from each other, and the offset between the first seating surface and the second seating surface corresponds to the thickness difference.

6. The communication apparatus of claim 3, wherein the substrate seating surface comprises a first seating surface on which the first printed circuit board is seated and a second seating surface on which the second printed circuit board is seated,
- wherein the first printed circuit board and the second printed circuit board are formed to have a common thickness,
- wherein the first seating surface and the second seating surface are formed to have a common height, and
- wherein the first side wall and the second side wall of the elastic connection member are formed to have a common height.

7. The communication apparatus of claim 2, wherein the support member comprises:
- a support base;
- a protruding seat projecting from one side of the support base and configured to receive the elastic connection member; and
- a retaining member formed on the protruding seat to secure the elastic connection member.

8. The communication apparatus of claim 7, wherein the connector comprises:
- a deformation gap formed between the support base and the elastic connection member when the first printed circuit board or the second printed circuit board is seated on the substrate seating surface to allow the elastic connection member to elastically deform.

9. The communication apparatus of claim 7, wherein the retaining member includes a retaining protrusion formed on the protruding seat, and the elastic connection member includes a through-hole into which the retaining protrusion is inserted.

10. The communication apparatus of claim 2, wherein the elastic connection member is made of beryllium copper or stainless steel alloy.

11. The communication apparatus of claim 2, wherein the support member is made of polycarbonate, Lusep, or Teflon.

12. The communication apparatus of claim 2, wherein the support member and the elastic connection member are integrally formed by multi-component injection molding.

13. The communication apparatus of claim 1, wherein the connector is configured to transfer radio frequency (RF) signals between the first printed circuit board and the second printed circuit board.

14. The communication apparatus of claim 1, wherein the apparatus enclosure is made of an aluminum alloy or a stainless steel alloy.

15. The communication apparatus of claim 1, wherein each of the first printed circuit board and the second printed circuit board is in direct contact with the apparatus enclosure.

16. A communication apparatus, comprising:

an apparatus enclosure comprising a substrate seating surface and at least one or more connection grooves formed on the substrate seating surface;

a first printed circuit board disposed on the substrate seating surface;

a second printed circuit board disposed on the substrate seating surface on one side of the first printed circuit board; and at least one or more connectors disposed within the connection groove and configured to electrically connect the first printed circuit board and the second printed circuit board, wherein the apparatus enclosure includes at least a portion formed with a plurality of heat sink fins.

17. A radio frequency (RF) connector, comprising:

an elastic connection member comprising a plate-shaped base, a first sidewall formed at one end of the plate-shaped base, a first contact portion formed at one end of the first sidewall, a second sidewall formed at an other end of the plate-shaped base, and a second contact portion formed at one end of the second sidewall; and a support member configured to support the elastic connection member, wherein the support member comprises:

a support base;

a protruding seat projecting from one side of the support base and configured to receive the elastic connection member; and a retaining member formed on the protruding seat to secure the elastic connection member.

18. The RF connector of claim 17, further comprising:

a deformation gap formed between the support base and the elastic connection member.

* * * * *